US006184062B1

United States Patent
Brofman et al.

(10) Patent No.: US 6,184,062 B1
(45) Date of Patent: Feb. 6, 2001

(54) PROCESS FOR FORMING CONE SHAPED SOLDER FOR CHIP INTERCONNECTION

(75) Inventors: Peter Jeffrey Brofman; Shaji Farooq; John U. Knickerbocker, all of Hopewell Junction; Scott Ira Langenthal, Hyde Park; Sudipta Kumar Ray, Wappingers Falls; Kathleen Ann Stalter, Hopewell Junction, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/233,383

(22) Filed: Jan. 19, 1999

(51) Int. Cl.$^7$ .................................................. H01L 21/44
(52) U.S. Cl. ..................... 438/106; 438/108; 438/128; 438/611; 438/612; 438/613; 257/772; 257/738; 257/778; 257/780
(58) Field of Search ................................. 438/106, 108, 438/128, 612, 611, 613; 257/772, 778, 780, 738

(56) References Cited

U.S. PATENT DOCUMENTS

| | | | |
|---|---|---|---|
| 4,751,563 | 6/1988 | Laibowitz et al. ................... 357/71 |
| 5,244,143 | 9/1993 | Ference et al. ................ 228/180.21 |
| 5,478,007 | 12/1995 | Marrs ............................. 228/180.22 |
| 5,527,734 | * 6/1996 | Van Der Putten ................... 437/183 |
| 5,587,337 | 12/1996 | Idaka et al. ........................... 437/183 |
| 5,984,164 | * 11/1999 | Wark ..................................... 228/164 |
| 6,046,071 | * 4/2000 | Sawai et al. ........................ 438/106 |
| 6,083,773 | * 7/2000 | Lake .................................... 438/108 |

* cited by examiner

Primary Examiner—Matthew Smith
Assistant Examiner—Belur V Keshavan
(74) Attorney, Agent, or Firm—DeLio & Peterson, LLC; Peter W. Peterson; Ira D. Blecker (57) ABSTRACT

A method of forming non-spherically shaped solder interconnects, preferably conical, for attachment of electronic components in an electronic module. Preferably, the solder interconnects of the present invention are cone shaped and comprise of depositing a first solder followed by a second solder having a lower reflow temperature than the first solder. Warm placement of the electronic component at a somewhat elevated temperature than room temperature but less than the solder reflow temperature reduces the force required during placement of a semiconductor chip to a substrate. After warm placement, reflow of the module occurs at the lower reflow temperature of the second solder. The conical shape of the solder interconnects are formed by a heated coining die which may also coin a portion of the interconnects with flat surfaces for stand-offs. The ability of the cone shaped solder interconnects to meet the opposing surface of a chip or substrate at different heights accommodates the camber typically associated with chip and substrate surfaces.

71 Claims, 4 Drawing Sheets

PROCESS FOR FORMING CONE SHAPED SOLDER FOR CHIP INTERCONNECTION

CROSS-RERERENCE TO RELATED APPLICATIONS

Aspects of the present invention are related to subject matter disclosed in co-pending applications entitled "Dielectric Interposer for Chip to Substrate Soldering," and "Underfill Preform Interposer for Joining Chip to Substrate," filed on even date herewith and assigned to the assignee of the present invention.

BACKGROUND OF THE INVENTION

1. Field of the Invention

This invention relates to the manufacture of electronic modules, namely flip chip packaging, utilizing an improved method of assembling the module. The improved method allows for enhanced contact with less stressing on the solder joints used to electrically interconnect a chip and a substrate resulting in an electronic module having higher integrity and reliability.

2. Description of Related Art

Multi-layer ceramic electronic components are typically joined together by soldering pads on a surface of one of the electronic components to corresponding pads on the surface of the other component. Controlled Collapse Chip Connection is an interconnect technology developed by IBM as an alternative to wire bonding. This technology is generally known as C4 technology or flip chip packaging. Broadly stated, one or more integrated circuit chips are mounted above a single or multi-layer ceramic substrate and pads on the chip are electrically and mechanically connected to corresponding pads on the substrate by a plurality of electrical connections such as solder bumps. The integrated circuit chips may be assembled in an array such as a 10×10 array on the multi-layer ceramic surface.

One of the key features in using flip chip packaging is the ability to accommodate a considerable distortion in pattern between the chip and the substrate. This accommodation is due to a self-alignment capability produced by surface tension minimization of the solder joints. What cannot be tolerated, however, is any significant deviation from planarity between the chip surface and the substrate surface since electrical interconnection cannot occur unless the solder bump on the chip physically contacts the substrate.

Multi-layer ceramic (MLC) chip carriers with flip chip technology often possess, due to design, the tendency to have localized bulges at the location of underlying substrate vias. In addition, residual camber (non-planarity) from sintering the substrate can lead to further non-planarity across the chip site. A camber magnitude much greater than about 25 to 30 microns will lead to non-contact opens after a chip join attempt. Thus, it is desirable to find a way of overcoming the non-planarity typically found on a chip and substrate used in flip chip packaging resulting in better solder interconnections.

U.S. Pat. No. 5,587,337 to Idaka et al. discloses a method of manufacturing bump electrodes with a larger top surface area than bottom surface area. Both surfaces are flat which would not overcome the non-planarity of a chip and substrate when joining such components in flip chip packaging.

U.S. Pat. No. 5,527,734 to van der Putten discloses a method of forming solder interconnections having a truncated pyramid shape. The truncated pyramidal shape of the solder is formed using an electroless metallization bath. This reference neither suggests nor discloses a method of overcoming the non-planarity of components in flip chip packaging. The flat top surface of the solder would not overcome the non-planarity of the electronic components in an electronic module.

U.S. Pat. No. 5,478,007 to Marrs discloses a method and structure for flip chip interconnection of a chip to a substrate utilizing a ball bond having a conical section and a base section. The disclosure includes a number of additional steps in forming the ball bond which add to an already cumbersome process. The reference neither suggests nor discloses a method of overcoming the non-planarity of the electronic components in a module.

U.S. Pat. No. 5,244,143 to Ference et al. (and assigned to the assignee of the present invention) discloses an apparatus and method of injection molding solder mounds onto electronic devices. This reference neither suggests nor disclose a method of overcoming the non-planarity of the electronic components when assembling electronic modules.

U.S. Pat. No. 4,751,563 to Laibowitz et al. discloses an interconnect with a contamination resist cone formed on a substrate. This reference neither suggests nor discloses a method or apparatus for overcoming the non-planarity of electronic components when assembling electronic modules.

Bearing in mind the problems and deficiencies of the prior art, it is therefore an object of the present invention to provide a method of overcoming the non-planarity of electronic components used in assembling electronic modules.

It is another object of the present invention to provide a method of assembling electronic modules having improved solder interconnections.

It is yet another object of the present invention to provide a solder preform which overcomes the problem of camber on electronic components used in flip chip packaging.

A further object of the invention is to provide an electronic module having improved reliability, integrity and less prone to electrical failure of solder interconnections.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a process for forming non-spherical shapes in solder interconnects on the surface of a substrate or a semiconductor die comprising the steps of: (a) depositing a first layer of solder onto a surface; (b) depositing a second layer of solder over the first layer of solder; and (c) forming the first and second layers of solder into a non-spherical shape, wherein the non-spherical shape of the solder interconnects facilitate joining between two surfaces.

Preferably, step (b) comprises depositing a second layer of solder having a lower melting temperature than the first layer of solder.

Preferably, step (c) comprises molding the first and second layers of solder into a non-spherical shape with a coining die comprising a rigid, non-solder wettable plate having an array of non-spherically shaped cavities, the die being heated to an elevated temperature. More preferably, step (c) comprises molding the plurality of solder interconnects with a heated coining die comprising a rigid, non-solder wettable plate having an array of non-spherically shaped cavities such that the coining die deforms the second layer of solder into a non-spherical shape. Most preferably, step (c) comprises molding the first and second layers of solder into a non-spherical shape, a portion of the non-spherical shapes comprising stand-offs.

The present invention relates to, in a second aspect, a process for forming non-spherical shapes in solder interconnects comprising the steps of: (a) providing a semiconductor wafer and a substrate for mounting the wafer; (b) applying a masking layer to the wafer or to the substrate; (c) patterning and developing a plurality of openings in the masking layer; (d) forming a plurality of solder interconnects by plating a layer of solder into the plurality of openings in the masking layer; and (e) molding the plurality of solder interconnects into a non-spherical shape, wherein the non-spherical shape of the plurality of solder interconnects facilitates joining of the wafer and the substrate in a non-planar environment.

The process may further include the step of applying a blanket seed layer to the wafer prior to step (b) wherein the step of applying a blanket seed layer to the wafer comprises applying a layer of chromium-copper alloy or a layer of titanium-copper alloy to the wafer. The seed layer not covered by the solder interconnects may be removed prior to step (e).

Preferably, step (b) comprises applying a photoresist to the wafer.

Preferably, step (d) comprises forming a plurality of solder interconnects by plating a first and second layer of solder into the plurality of openings in the masking layer. More preferably, the first layer of solder has a thickness of about 0.1 to 0.13 mm. More preferably, the second layer of solder has a thickness of about 0.02 to 0.025 mm. Even more preferably, step (d) comprises forming a plurality of solder interconnects wherein the first layer of solder has a thickness of about 0.1 to 0.13 mm and a diameter of about 0.1 to 0.13 mm and the second layer of solder has a thickness of about 0.02 to 0.025 mm.

The process may also comprise, in step (d), forming a plurality of solder interconnects by plating a first and second layer of solder into the plurality of openings in the masking layer wherein the first layer of solder comprises a higher melting solder than the second layer of solder. Preferably, the process may further include the steps of molding the plurality of solder interconnects into a conical shape, contacting the wafer with the substrate and reflowing the second layer of solder to facilitate joining of the wafer and the substrate.

Step (d) may comprise forming a plurality of solder interconnects by plating a first layer of solder comprising a lead-tin alloy into the plurality of openings in the masking layer. Step (d) may also comprise forming a plurality of solder interconnects by plating a second layer of solder comprising a tin alloy into the plurality of openings in the masking layer. Preferably, the tin alloy is selected from the group consisting of eutectic tin-lead, tin-bismuth, and tin-indium. Most preferably, step (d) comprises forming a plurality of solder interconnects by plating a first layer of solder comprising a lead-tin alloy and a second layer of solder comprising a tin alloy into the plurality of openings in the masking layer.

Preferably, step (e) comprises molding the plurality of solder interconnects into a conical shape, and even more preferably, wherein the first layer of solder has a base angle of about 75 to 80 degrees and the second layer of solder has a base angle of about 65 to 70 degrees.

Preferably, step (e) includes molding the plurality of solder interconnects into a first non-spherical shape and a second non-spherical shape wherein the second non-spherical shape has a flat top for stand-offs.

Preferably, step (e) comprises molding the plurality of solder interconnects into a non-spherical shape with a heated coining die comprising a rigid, non-solder wettable plate having an array of non-spherically shaped cavities wherein the heated coining die deforms the plurality of solder interconnects into a non-spherical shape. Most preferably, the plate of the coining die comprises a material selected from the group consisting of glass, molybdenum alloy, titanium alloy, titanium-tungsten alloy, nickel alloy and stainless steel.

Preferably, step (e) comprises molding the plurality of solder interconnects with the coining die into a cone shape. Most preferably, step (e) comprises molding a first portion of the plurality of solder interconnects into a non-spherical shape and a second portion of the plurality of solder interconnects to form stand-offs with a coining die having non-spherically shaped cavities and stand-off shaped cavities.

The process may further include the step of contacting the wafer with the substrate. Preferably, the step of contacting the wafer with the substrate comprises reflowing the solder interconnects to facilitate joining of the wafer and the substrate. Most preferably, the step of joining the wafer and the substrate is adapted to accommodate up to about 50 microns of camber on the substrate.

Preferably, during the step of reflowing the solder interconnects, a portion of the solder interconnects are stand-offs having a flat surface with a height less than the non-spherically shaped solder interconnects such that the stand-offs limit the extent of collapse of the cone shaped solder interconnects during reflow. Most preferably, during the step of reflowing the solder interconnects, the standoffs are about 25 to 40 microns shorter than the solder interconnects such that the extent of collapse of the cone shaped solder interconnects during reflow is limited. Even more preferably, the plurality of solder interconnects comprises a first layer of solder and a second layer of solder, the first layer of solder having a higher melting temperature than the second layer of solder, and wherein the step of reflowing occurs at the melting temperature of the second layer of solder.

The process may further include the step of forming stand-offs comprising polyimide on the semiconductor wafer.

In another aspect, the present invention is directed to a process for forming cone shaped solder on a semiconductor wafer or a substrate for use in controlled chip collapse connections comprising the steps of: (a) providing a first surface; (b) applying a bond pad for a connection to the surface; (c) applying a seed layer over the surface; (d) applying and patterning a masking layer over the seed layer to form an opening in the masking layer exposing the seed layer; (e) plating a metal solder into the opening of the masking layer; (f) stripping the masking layer; (g) removing the seed layer not covered by the solder; and (h) molding the solder to form a cone shape.

Preferably, step (a) comprises providing a semiconductor surface or a substrate surface; step (b) comprises applying a bond pad comprising layers of silicon oxide, chromium and copper; step (c) comprises applying a layer of chromium/copper alloy or titanium/copper alloy over the surface; and step (d) comprises applying and patterning a photoresist layer over the seed layer to form an opening in the masking layer exposing the seed layer.

Preferably, step (e) comprises plating a first solder followed by plating a second solder, and, most preferably, wherein the second solder has a lower melting temperature than the first solder. Even more preferably, step (e) comprises plating a first solder comprising a 97% lead 3% tin alloy followed by plating a second solder comprising a eutectic tin/lead alloy.

Preferably, step (h) comprises molding the solder to form a cone shaped wherein the cone shape has a taper about 15 to 25 degrees from the vertical. More preferably, step (h) comprises molding the solder with a coining die to form the cone shaped solder. The coining die may comprise a rigid, non-solder wettable plate having an array of conically shaped cavities. Preferably, step (h) comprises molding the solder with a heated coining die comprising a rigid, non-solder wettable plate having an array of conically shaped cavities. Most preferably, step (h) comprises molding the solder with a coining die comprising a rigid, non-solder wettable plate having conically shaped cavities and trapezoidally shaped cavities. The coining die molds a portion of the solder into trapezoidal shapes as stand-offs wherein the stand-offs control the collapse of the solder during contact between a semiconductor wafer and a substrate.

Preferably, step (e) comprises plating a first solder followed by plating a second solder having a lower melting temperature than the first solder into the opening of the masking layer and step (h) comprises molding the first and second solders with a heated coining die comprising a rigid, non-solder wettable plate having an array of conically shaped cavities. More preferably, the heating element of the coining die deforms the second solder to form the conical shape.

The process may further include the step of forming polyimide standoffs, and wherein the polyimide standoffs are formed on a semiconductor surface or a substrate surface.

In yet another aspect, the present invention is directed to a method of joining semiconductor chips and substrates in a non-planar environment using non-spherically shaped solder comprising the steps of: (a) providing a semiconductor chip and a substrate for mounting the chip; (b) forming a plurality of non-spherical solder interconnects on a surface of the chip or substrate; (c) forming standoffs on a surface of the chip or the substrate; and (d) contacting the chip with the substrate, whereby the placement force is reduced and the standoffs limit the extent of collapse of the solder interconnects.

The process may further include, prior to step (b), the step of applying and patterning a photoresist to the surface of the chip or the substrate on which surface the solder interconnects are formed.

Preferably, step (b) further comprises the steps of: plating a first solder on a surface of the chip or the substrate; plating a second solder over the first solder; and molding the solders with a heated coining die comprising a rigid, non-solder wettable plate having an array of non-spherically shaped cavities such that the heated coining die deforms the second solder to form the non-spherical shape. More preferably, the first layer of solder comprises a higher melting point solder than the second layer of solder. Even more preferably, the first layer of solder comprises a lead-tin alloy and the second layer of solder comprises a tin alloy.

Preferably, the step of contacting the chip to the substrate occurs at an elevated temperature greater than room temperature but less than the solder reflow temperature.

Preferably, the non-spherical shape is conical, and most preferably, the conical shape of the solder interconnect has a base angle of about 75 to 80 degrees.

The plurality of solder interconnects and the standoffs can be formed on a surface of a chip or a substrate.

In still yet another aspect, the present invention is directed to a method of joining semiconductor chips and substrates in a non-planar environment using non-spherically shaped solder comprising the steps of: (a) providing a semiconductor chip and a substrate for mounting the chip; (b) forming a plurality of non-spherical solder interconnects on a surface of the chip; (c) forming standoffs on a surface of the chip or substrate; and (d) contacting the chip with the substrate, whereby the placement force is reduced and the standoffs limit the extent of collapse of the solder interconnects.

In a further aspect, the present invention is directed to a method of joining semiconductor chips and substrates in a non-planar environment using non-spherically shaped solder comprising the steps of: (a) providing a semiconductor chip and a substrate for mounting the chip; (b) forming a plurality of non-spherical solder interconnects on a surface of the substrate; (c) forming standoffs on a surface of the chip or the substrate; and (d) contacting the chip with the substrate, whereby the placement force is reduced and the standoffs limit the extent of collapse of the solder interconnects.

In yet another aspect, the present invention is directed to a semiconductor substrate having at least one electrical element formed thereon, the substrate comprising at least one bonding pad disposed on the substrate corresponding to the electrical element; and a cone shaped solder interconnect on the bonding pad adapted for electrical and mechanical connection to the electrical element.

In a final aspect, the present invention relates to a semiconductor chip having at least one electrical element formed thereon, the chip comprising at least one bonding pad disposed on the substrate corresponding to the electrical element; and a cone shaped solder interconnect on the bonding pad adapted for electrical and mechanical connection to the electrical element.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–9 of the drawings in which like numerals refer to like features of the invention. Features of the invention are not necessarily shown to scale in the drawings.

Figure 1:
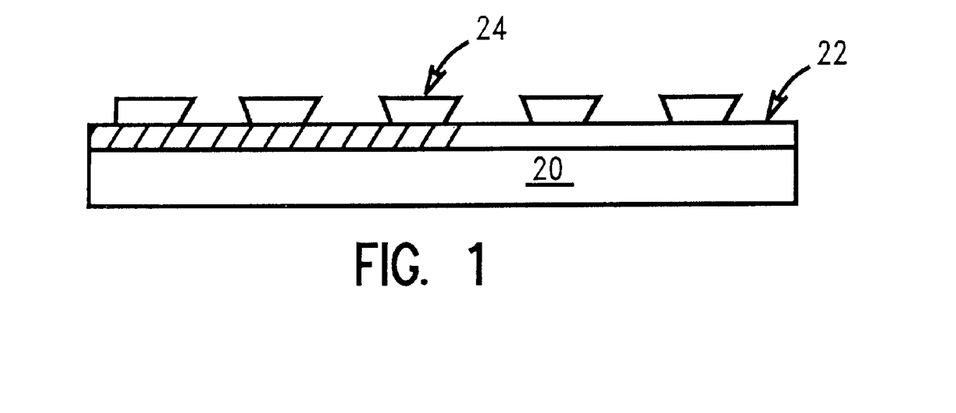
FIG. 1 is an elevational cross-sectional view of a semiconductor chip in utilizing a method of the present invention.

In FIG. 1, a semiconductor chip 20 has been processed through all prior processes such as device formation, and wiring layers as shown. At this stage, the wafer 20 has a deposited blanket seed layer 22 such as a chromium copper alloy or a titanium copper alloy. Upon the seed layer 22, a thick film resist 24 is deposited, patterned and developed according to a desired array for solder interconnections. A typical photoresist used in this process is Riston™.

Figure 2:
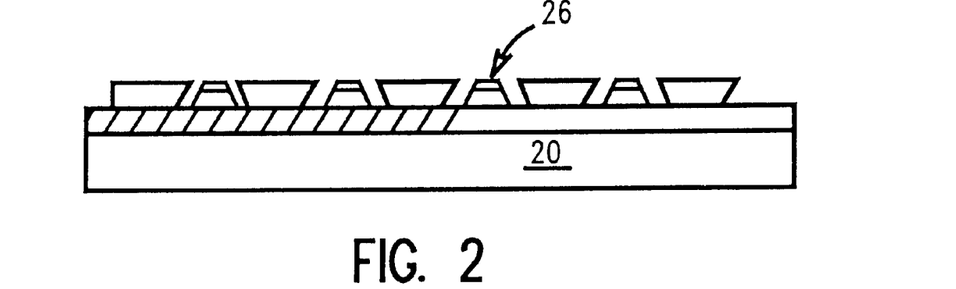
FIG. 2 is an elevational cross-sectional view of a semiconductor chip during formation of the solder preforms according to a method of the present invention.
Figure 3:
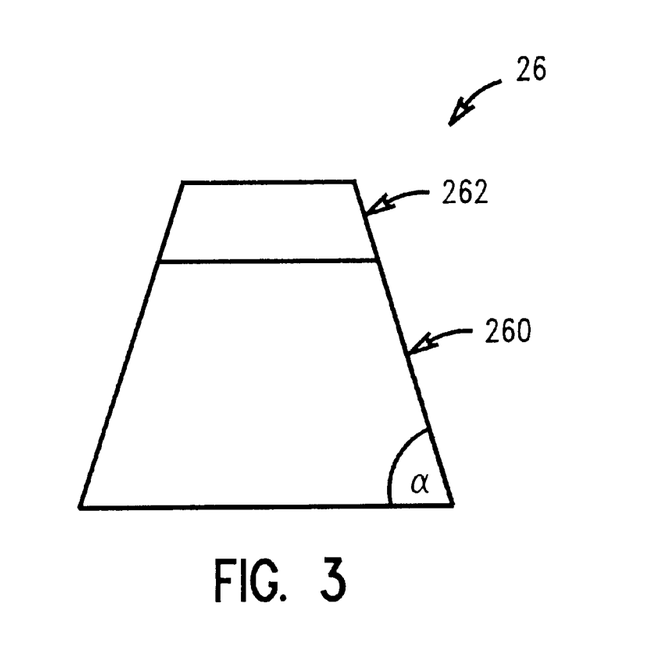
FIG. 3 is an elevational cross-sectional view of a solder preform prior to coining.

Once the photo resist 24 has been developed, a solder preform is formed in the exposed areas of the resist. Preferably, a two layer solder preform 26 is plated or otherwise deposited as shown in FIGS. 2 and 3. The first solder layer 260 may be a high melting solder alloy such as 97% lead/3% tin having a melting point of about 317° C. The second solder layer 262 may comprise a lower melting solder alloy such as a eutectic tin/lead alloy, tin/bismuth alloy or tin/indium alloy with melting points in the range of about 118 to 183° C. After these layers are deposited, the resist 24 is stripped off and the seed layer 22 is etched off.

The dimensions appropriate for certain high density solder preforms are shown in FIG. 3. The first solder layer 260 has a height of approximately 0.13 mm. The second solder layer 262 has a thickness of approximately 0.025 mm. The angle alpha of the solder pyramid is determined by the type of resist used, the exposure parameters, and the development parameters utilized. Typically, the angle alpha of the solder pyramid will be in the range of about 75 to 80° for a negative resist such as Riston™.

Figure 4:
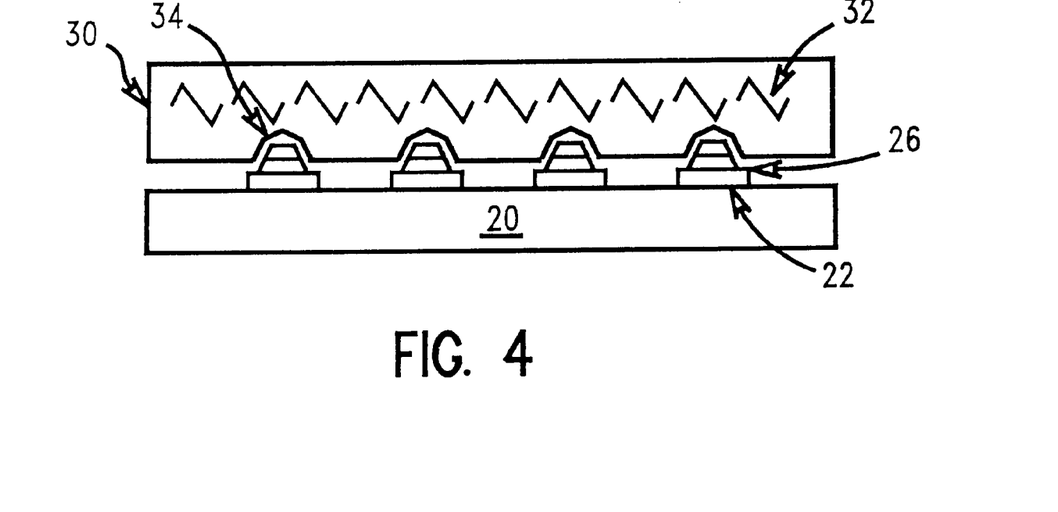
FIG. 4 is an elevational cross-sectional view of a semiconductor chip having solder preforms of the present invention during coining of the solder preforms.
Figure 5:
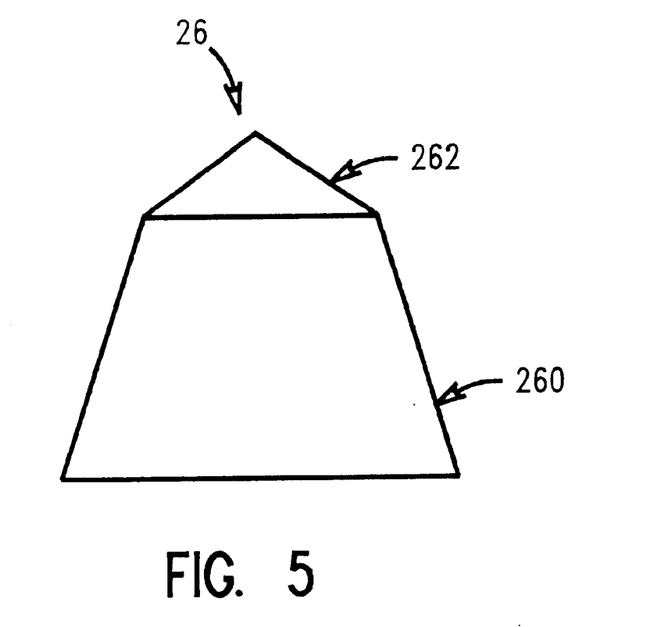
FIG. 5 is an elevational cross-sectional view of a coined solder preform according to a method of the present invention.

According to a method of the present invention, once the solder interconnect 26 has been formed, a coining tool is used to form or mold the cone shaped solder as shown in FIGS. 4 and 5. A coining tool 30 is used which has an array of cavities 34 fabricated into a metal plate. The metal plate may be made from molybdenum, nickel alloy, titanium, titanium/tungsten alloy, stainless steel, or any such material not wettable by the solder. The cavity array 34 is made such that each cavity is shaped with an opening whose slope is close to the slope of the desired solder preforms made by the process described above. In addition, the inner part of the cavity 34 has a cone shape, whose slope is less steep than the entrance hole.

The metal plate of the coining tool may also contain a heating coil 32 or other similar heating device to heat the plate to a temperature in the range of about 140 to 170° C. This coining tool 30 is aligned to, and pressed down upon the solder preforms. With the combination of heat and applied pressure, the lower melting solder layer 262 will undergo a plastic deformation, and flow into the cone shape cavity array 34 of the coining tool 30. FIG. 5 depicts a solder preform 26 which has been shaped into a cone shape. The angle alpha of the first solder layer 260 will still be about 75 to 80° while the angle alpha of the second solder layer 262 will have an angle of about 65 to 70° if the cavity 34 has a slope of about 80°.

Figure 6:
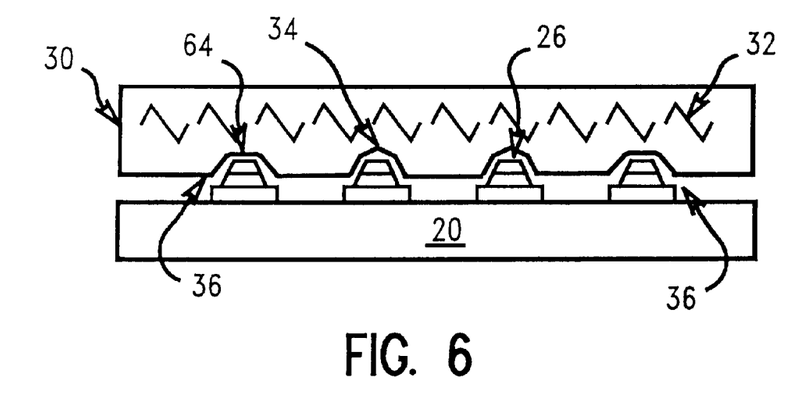
FIG. 6 is an elevational cross-sectional view of solder preforms on a chip being coined according to a method of the present invention.
Figure 7:
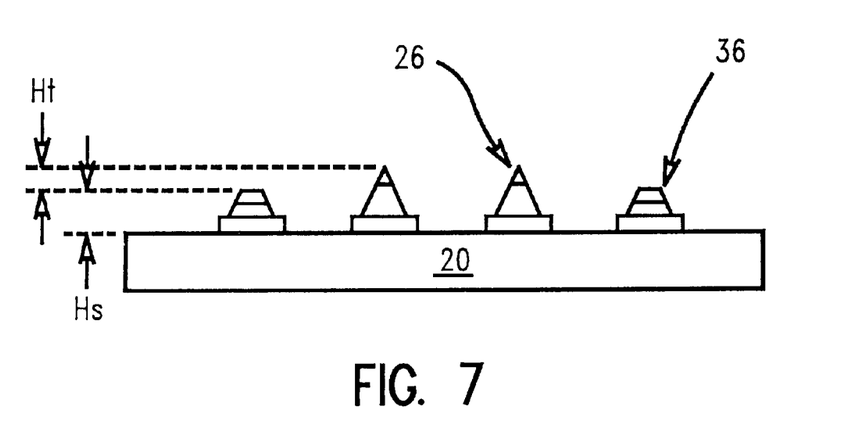
FIG. 7 an elevational cross-sectional view of a semiconductor chip having solder preforms and standoffs made according to a method of the present invention.

The main use of these cone shape solder preforms is for joining silicon chips to substrates with camber such that the cone tips will make contact with substrate pads at different z axis heights from the device surface. To assure that the cone shape solders are not deformed too much during the placement of chips, standoffs at four corner locations on the chips may be required. The metal die used to fabricate the cone shape solder preforms can also be used to create standoffs. This is shown in FIGS. 6 and 7. The four corner locations of the cavities in the die 30 will have a flat surface rather than of the conical shape. Alternatively, polyimide standoffs may be formed on either of the chip or substrate surfaces according to known methods in the art.

In FIG. 6 is shown a chip 20 with solder preforms 26 and 36. A coining tool 30 having a heating element 32 has cavities 34 for shaping a portion of the solder preforms into a conical shape. Cavities 36 have a truncated conical shape for coining solder preforms into a truncated cone shape with a flattened surface. The resulting truncated cone shape solder preforms become standoffs during assembly of the electronic module to control the collapse of the cone shape solder preforms of chip 20 onto a substrate, package or board.

The cone shaped solder preforms 26 will typically be 25–40 microns higher than the standoff solder preforms 36 (referring to $H_t$). The standoff height $H_s$ will typically be about 0.13 mm for the dimensions of the solder preforms described above. As a result of these differences in height between the cone shape solder preforms and the standoff solder preforms, the placement of these devices will accommodate up to about 25–40 microns of height differential in the z axis direction between the substrate surface and the chip surface to which these solder preforms are attached to. This alleviates the problems associated with the camber found on many substrate sites.

Figure 8:
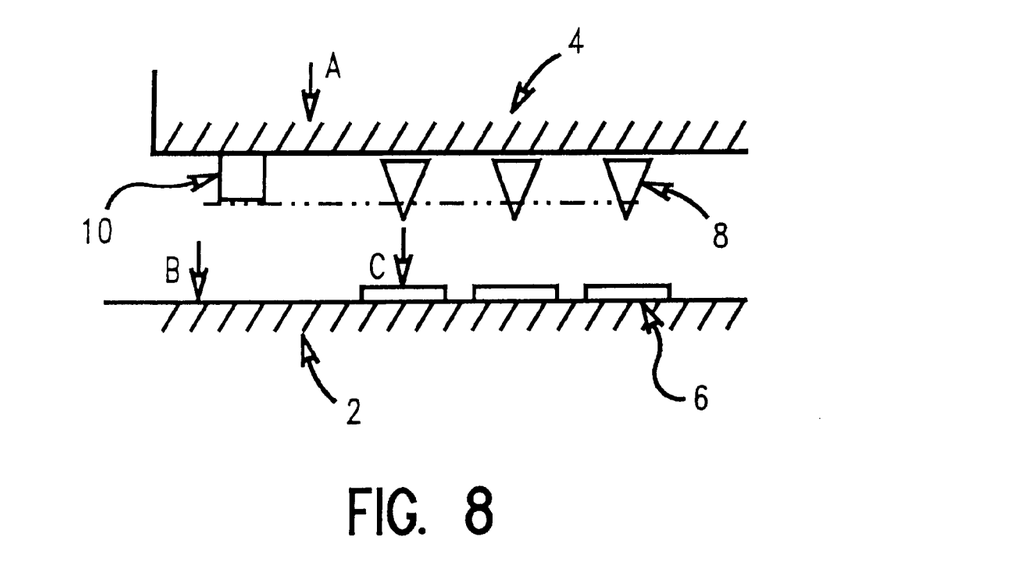
FIG. 8 is a partial elevational cross-sectional view of cone shape solder preforms and standoffs according to a preferred method of assembling an electronic module according to the present invention.

In assembling an electronic module according to the present invention, FIG. 8 shows a partial cross-sectional view of electronic components comprising a chip 4 having cone shape solder interconnections 8 formed on its surface with a polyimide standoff 10. The chip 4 will be interconnected to substrate 2 having bonding pads 6 corresponding to the solder interconnections 8 on the chip 4. Chip 4 will be placed over substrate 2 in the direction of arrow A. The polyimide standoff 10 will contact the substrate 2 surface in the vicinity of arrow B while the solder interconnections 8 will contact the corresponding bonding pad 6 on substrate surface 2 in the vicinity of arrow C. Of course, the cone shape solder interconnections and standoffs may be formed on the substrate 2 as well.

Figure 9:
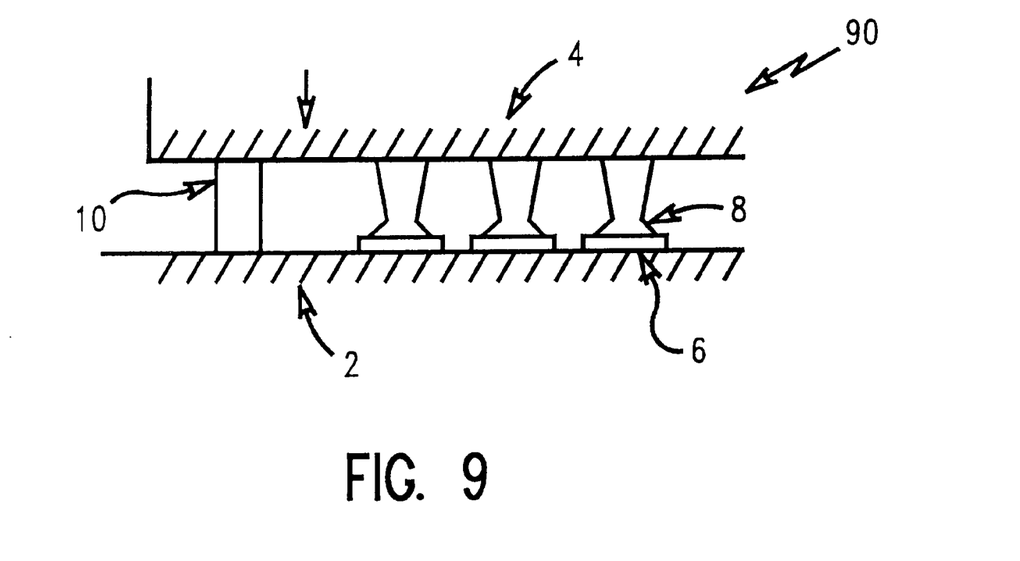
FIG. 9 is a partial elevational cross-sectional view of an electronic module of the present invention.

The resultant electronic module 90 is shown in FIG. 9 where the conical shapes of the solder interconnections 8 and the polyimide standoff 10 limit the extent of collapse of the solder preforms 8 during placement. Preferably, placement of chip 4 onto substrate 2 is done at a somewhat elevated temperature greater than room temperature but less than the solder reflow temperature, most preferably about 100 to 150° C. to reduce the force required during placement. This type of warm placement reduces the stresses placed on all the components during the assembly of the electronic module while the conical shape of the solder interconnections also allow increased stability and reliability of the solder interconnections. After warm placement, the electronic module is taken through a furnace reflow cycle with a peak temperature such that the lower temperature solder layer 262 is reflowed. Typically for Sn eutectic solder the reflow temperature is in the range of 190–210° C.

The present invention achieves the objects recited above. The use of the solder preforms of the present invention provides a solution to overcome the non-planarity of electronic components used in assembling electronic modules. The ability of the solder preforms, preferably having a cone shape, to meet the opposing surface of a chip or substrate at different heights accommodates the non-planarity typically found on chip and substrate surfaces. This improves the solder interconnections and results in electronic modules with increased reliability and integrity. The ease in producing standoffs while also forming the solder preforms reduces the number of steps in an already cumbersome manufacturing process. Additionally, joining the chip and substrate at a reduced temperature further reduces the thermal stresses placed on the components during assembly while providing controlled placement of the components.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for forming non-spherical shapes in solder interconnects on the surface of a substrate or a semiconductor die comprising the steps of:
    a) depositing a first layer of solder onto a surface;
    b) plating a second layer of solder over said first layer of solder; and
    c) forming said first and second layers of solder into a non-spherical shape
wherein the non-spherical shape of said solder interconnects facilitate joining between two surfaces.

2. The process according to claim 1, wherein step (b) comprises plating a second layer of solder having a lower melting temperature than said first layer of solder.

3. The process according to claim 1, wherein step (c) comprises molding said first and second layers of solder into a non-spherical shape with a coining die comprising a rigid, non-solder wettable plate having an array of non-spherically shaped cavities, said die being heated to an elevated temperature.

4. The process according to claim 1, wherein step (c) comprises molding said plurality of solder interconnects with a heated coining die comprising a rigid, non-solder wettable plate having an array of non-spherically shaped cavities such that said coining die deforms said second layer of solder into a non-spherical shape.

5. The process according to claim 1, wherein step (c) comprises molding said first and second layers of solder into a non-spherical shape, a portion of said non-spherical shapes comprising stand-offs.

6. A process for forming non-spherical shapes in solder interconnects comprising the steps of:
    (a) providing a semiconductor wafer and a substrate for mounting said wafer;
    (b) applying a masking layer to said wafer or to said substrate;
    (c) patterning and developing a plurality of openings in said masking layer;
    (d) forming a plurality of solder interconnects by plating a layer of solder into said plurality of openings in said masking layer; and
    (e) molding said plurality of solder interconnects into a non-spherical shape,
wherein the non-spherical shape of said plurality of solder interconnects facilitates joining of said wafer and said substrate in a non-planar environment.

7. The process according to claim 6, further including the step of applying a blanket seed layer to said wafer prior to step (b).

8. The process according to claim 7, wherein said step of applying a blanket seed layer to said wafer comprises applying a layer of chromium-copper alloy to said wafer.

9. The process according to claim 7, wherein said step of applying a blanket seed layer to said wafer comprises applying a layer of titanium-copper alloy to said wafer.

10. The process according to claim 7, further including the step of removing said seed layer not covered by said solder interconnects prior to step (e).

11. The process according to claim 6, wherein step (b) comprises applying a photoresist to said wafer.

12. The process according to claim 6, wherein step (d) comprises forming a plurality of solder interconnects by plating a first and second layer of solder into said plurality of openings in said masking layer.

13. The process according to claim 12, wherein step (d) comprises forming a plurality of solder interconnects wherein said first layer of solder has a thickness of about 0.1 to 0.13 mm and a diameter of about 0.1 to 0.13 mm.

14. The process according to claim 12, wherein step (d) comprises forming a plurality of solder interconnects wherein said second layer of solder has a thickness of about 0.02 to 0.025 mm.

15. The process according to claim 12, wherein step (d) comprises forming a plurality of solder interconnects wherein said first layer of solder has a thickness of about 0.1 to 0.13 mm and a diameter of about 0.1 to 0.13 mm and said second layer of solder has a thickness of about 0.02 to 0.025 mm.

16. The process according to claim 12, wherein step (d) comprises forming a plurality of solder interconnects by plating a first and second layer of solder into said plurality of openings in said masking layer wherein said first layer of solder comprises a higher melting solder than said second layer of solder.

17. The process according to claim 16, further including the steps of molding said plurality of solder interconnects into a conical shape, contacting said wafer with said substrate and reflowing said second layer of solder to facilitate joining of said wafer and said substrate.

18. The process according to claim 12, wherein step (d) comprises forming a plurality of solder interconnects by plating a first layer of solder comprising a lead-tin alloy into said plurality of openings in said masking layer.

19. The process according to claim 18, wherein said tin alloy is selected from the group consisting of eutectic tin-lead, tin-bismuth, and tin-indium.

20. The process according to claim 12, wherein step (d) comprises forming a plurality of solder interconnects by plating a second layer of solder comprising a tin alloy into said plurality of openings in said masking layer.

21. The process according to claim 12, wherein step (d) comprises forming a plurality of solder interconnects by plating a first layer of solder comprising a lead-tin alloy and a second layer of solder comprising a tin alloy into said plurality of openings in said masking layer.

22. The process according to claim 12, wherein step (e) comprises molding said plurality of solder interconnects into a conical shape wherein said first layer of solder has a base angle of about 75 to 80 degrees and said second layer of solder has a base angle of about 65 to 70 degrees.

23. The process according to claim 6, wherein step (e) comprises molding said plurality of solder interconnects into a conical shape.

24. The process according to claim 6, wherein step (e) comprises molding said plurality of solder interconnects into a conical shape having a base angle of about 75 to 80 degrees.

25. The process according to claim 24, wherein during step (e) said second non-spherical shape has a flat top for stand-offs.

26. The process according to claim 25, wherein step (e) comprises molding said plurality of solder interconnects with said heated coining die such that said coining die deforms said plurality of solder interconnects into a non-spherical shape.

27. The process according to claim 25, wherein during step (e) said plate of said coining die comprises a material selected from the group consisting of glass, molybdenum alloy, titanium alloy, titanium-tungsten alloy, nickel alloy and stainless steel.

28. The process according to claim 25, wherein step (e) comprises molding said plurality of solder interconnects with said coining die into a cone shape.

29. The process according to claim 6, wherein step (e) includes molding said plurality of solder interconnects into a first non-spherical shape and a second non-spherical shape.

30. The process according to claim 6, wherein step (e) comprises molding said plurality of solder interconnects into a non-spherical shape with a heated coining die comprising a rigid, non-solder wettable plate having an array of non-spherically shaped cavities.

31. The process according to claim 6, wherein step (e) comprises molding a first portion of said plurality of solder interconnects into a non-spherical shape and a second portion of said plurality of solder interconnects to form stand-offs with a coining die having non-spherically shaped cavities and stand-off shaped cavities.

32. The process according to claim 31, wherein the step of contacting said wafer with said substrate comprises reflowing said solder interconnects to facilitate joining of said wafer and said substrate.

33. The process according to claim 31, wherein said step of joining said wafer and said substrate is adopted to accommodate up to about 50 microns of camber on said substrate.

34. The process according to claim 31, wherein during said step of reflowing said solder interconnects, a portion of said solder interconnects are stand-offs having a flat surface with a height less than said non-spherically shaped solder interconnects such that said stand-offs limit the extent of collapse of said cone shaped solder interconnects during reflow.

35. The process according to claim 34, wherein during said step of reflowing said solder interconnects, said stand-offs are about 25 to 40 microns shorter than said solder interconnects such that the extent of collapse of said cone shaped solder interconnects during reflow is limited.

36. The process according to claim 34 wherein said plurality of solder interconnects comprises a first layer of solder and a second layer of solder, said first layer of solder having a higher melting temperature than said second layer of solder, and wherein said step of reflowing occurs at the melting temperature of said second layer of solder.

37. The process according to claim 6, further including the step of contacting said wafer with said substrate.

38. The process according to claim 6, further including the step of forming stand-offs comprising polyimide on said semiconductor wafer.

39. A process for forming cone shaped solder on a semiconductor wafer or a substrate for use in controlled chip collapse connections comprising the steps of:

(a) providing a first surface;

(b) applying a bond pad for a connection to said surface;

(c) applying a seed layer over said surface;

(d) applying and patterning a masking layer over said seed layer to form an opening in said masking layer exposing said seed layer;

(e) plating a metal solder into the opening of said masking layer;

(f) stripping said masking layer;

(g) removing said seed layer not covered by said solder; and (h) molding said solder to form a cone shape.

40. The process according to claim 39, wherein step (a) comprises providing a semiconductor surface.

41. The process according to claim 39, wherein step (a) comprises providing a substrate surface.

42. The process according to claim 39, wherein step (b) comprises applying a bond pad comprising layers of silicon oxide, chromium and copper.

43. The process according to claim 39, wherein step (c) comprises applying a layer of chromium/copper alloy over said surface.

44. The process according to claim 39, wherein step (c) comprises applying a layer of titanium/copper alloy over said surface.

45. The process according to claim 39, wherein step (d) comprises applying and patterning a photoresist layer over said seed layer to form an opening in said masking layer exposing said seed layer.

46. The process according to claim 39, wherein step (e) comprises plating a first solder followed by plating a second solder.

47. The process according to claim 39, wherein step (e) comprises plating a first solder followed by plating a second solder having a lower melting temperature than said first solder.

48. The process according to claim 39, wherein step (e) comprises plating a first solder comprising a 97% lead/3% tin alloy followed by plating a second solder comprising a eutectic tin/lead alloy.

49. The process according to claim 39, wherein step (h) comprises molding said solder to form a cone shaped wherein said cone shape has a taper about 15 to 25 degrees from the vertical.

50. The process according to claim 39, wherein step (h) comprises molding said solder with a coining die to form the cone shaped solder.

51. The process according to claim 50, wherein step (h) comprises molding said solder with a coining die comprising a rigid, non-solder wettable plate having an array of conically shaped cavities.

52. The process according to claim 51, wherein step (h) comprises molding said solder with a heated coining die comprising a rigid, non-solder wettable plate having an array of conically shaped cavities.

53. The process according to claim 39, wherein step (h) comprises molding said solder with a coining die comprising a rigid, non-solder wettable plate having conically shaped cavities and trapezoidally shaped cavities.

54. The process according to claim 53, wherein during step (h) said coining die molds a portion of said solder into trapezoidal shapes as stand-offs wherein said stand-offs control the collapse of said solder during contact between a semiconductor wafer and a substrate.

55. The process according to claim 39, wherein step (e) comprises plating a first solder followed by plating a second solder having a lower melting temperature than said first solder into the opening of said masking layer and step (h) comprises molding said first and second solders with a heated coining die comprising a rigid, non-solder wettable plate having an array of conically shaped cavities.

56. The process according to claim 55, wherein step (h) comprises molding said first and second solders with a heated coining die comprising a rigid, non-solder wettable plate having an array of conically shaped cavities such that said heated coining die deforms said second solder to form said conical shape.

57. The process according to claim 39, further including the step of forming polyimide standoffs.

58. The process according to claim 57, wherein said polyimide standoffs are formed on a semiconductor surface.

59. The process according to claim 57, wherein said polyimide standoffs are formed on a substrate surface.

60. A method of joining semiconductor chips and substrates in a non-planar environment using non-spherically shaped solder comprising the steps of:
(a) providing a semiconductor chip and a substrate for mounting said chip;
(b) forming a plurality of non-spherical solder interconnects on a surface of said chip or substrate;
(c) forming standoffs on a surface of said chip or said substrate; and
(d) contacting said chip with said substrate,
whereby the placement force is reduced and said standoffs limit the extent of collapse of said solder interconnects.

61. The process according to claim 60, further including, prior to step (b), the step of applying and patterning a photoresist to said surface of said chip or said substrate on which surface said solder interconnects are formed.

62. The process according to claim 60, wherein step (b) further comprises the steps of:
(a) plating a first solder on a surface of said chip or said substrate; and
(b) plating a second solder over said first solder; and molding said solders with a heated coining die comprising a rigid, non-solder wettable plate having an array of non-spherically shaped cavities such that said heated coining die deforms said second solder to form said non-spherical shape.

63. The process according to claim 62, wherein said first layer of solder comprises a higher melting point solder than said second layer of solder.

64. The process according to claim 62, wherein said first layer of solder comprises a Lead-tin alloy and said second layer of solder comprises a tin alloy.

65. The process according to claim 60, wherein said contacting of said chip to said substrate occurs at an elevated temperature greater than room temperature but less than said solder reflow temperature.

66. The process according to claim 60, wherein said non-spherical shape is conical.

67. The process according to claim 66, wherein said conical shape of said solder interconnect having a base angle of about 75 to 80 degrees.

68. The process according to claim 60, wherein said plurality of solder interconnects and said standoffs are formed on a surface of a chip.

69. The process according to claim 60, wherein said plurality of solder interconnects and said standoffs are formed on a surface of a substrate.

70. A method of joining semiconductor chips and substrates in a non-planar environment using non-spherically shaped solder comprising the steps of:
(a) providing a semiconductor chip and a substrate for mounting said chip;
(b) forming a plurality of non-spherical solder interconnects on a surface of said chip;
(c) forming standoffs on a surface of said chip or substrate; and
(d) contacting said chip with said substrate,
whereby the placement force is reduced and said standoffs limit the extent of collapse of said solder interconnects.

71. A method of joining semiconductor chips and substrates in a non-planar environment using non-spherically shaped solder comprising the steps of:
(a) providing a semiconductor chip and a substrate for mounting said chip;
(b) forming a plurality of non-spherical solder interconnects on a surface of said substrate;
(c) forming standoffs on a surface of said chip or said substrate; and
(d) contacting said chip with said substrate,
whereby the placement force is reduced and said standoffs limit the extent of collapse of said solder interconnects.

* * * * *